(12) United States Patent
Maekawa et al.

(10) Patent No.: US 6,291,619 B1
(45) Date of Patent: Sep. 18, 2001

(54) PHOTOSENSITIVE RESIN COMPOSITION, METHOD FOR FORMING PATTERN THEREFROM, ELECTRONIC DEVICES PRODUCED BY USING THE SAME, AND METHOD FOR PRODUCTION THEREOF

(75) Inventors: Yasunari Maekawa, Hitachi; Takao Miwa, Hitachinaka; Takumi Ueno, Mito; Yoshiaki Okabe, Hitachi, all of (JP)

(73) Assignee: Hitachi Chemical Co., LTD, Tokyo (JP)

( * ) Notice: Subject to any disclaimer, the term of this patent is extended or adjusted under 35 U.S.C. 154(b) by 0 days.

(21) Appl. No.: 09/355,506
(22) PCT Filed: Jan. 28, 1998
(86) PCT No.: PCT/JP98/00348
§ 371 Date: Jul. 29, 1999
§ 102(e) Date: Jul. 29, 1999
(87) PCT Pub. No.: WO98/34159
PCT Pub. Date: Aug. 6, 1998

(30) Foreign Application Priority Data

Jan. 30, 1997 (JP) .................................................. 9-016755

(51) Int. Cl.$^7$ .................................................. C08F 126/00
(52) U.S. Cl. .................. 526/312; 526/310; 526/302; 526/321
(58) Field of Search .................. 526/302, 318, 526/312, 321

(56) References Cited

U.S. PATENT DOCUMENTS

| | | | |
|---|---|---|---|
| 4,933,452 | * | 6/1990 | White et al. .............. 544/204 |
| 5,667,931 | * | 9/1997 | Lee et al. .............. 430/191 |

FOREIGN PATENT DOCUMENTS

| | | |
|---|---|---|
| 0 224 680 | 6/1987 | (EP) . |
| 0 505 161 | 9/1992 | (EP) . |
| 1331441 * | 9/1973 | (GB) . |
| 1-59571 | 8/1983 | (JP) . |
| 4-204738 | 11/1990 | (JP) . |
| 4-345164 | 5/1991 | (JP) . |
| 4-31860 | 2/1992 | (JP) . |
| 4-168441 | 6/1992 | (JP) . |
| 4-274431 | 9/1992 | (JP) . |
| 5-11451 | 1/1993 | (JP) . |
| 6-43648 | 2/1994 | (JP) . |
| 8-104808 | 4/1996 | (JP) . |
| 08 113708 | 5/1996 | (JP) . |
| 08 113709 | 5/1996 | (JP) . |
| 08 113710 | 5/1996 | (JP) . |

* cited by examiner

Primary Examiner—Helen L. Pezzuto
(74) Attorney, Agent, or Firm—Griffin & Szipl, P.C.

(57) ABSTRACT

A photosensitive composition comprising a polyimide precursor, a photosensitive material having a structure represented by the following formula

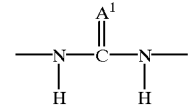

wherein $A^1$ is an atom belonging to Group VI of the periodic table, in the molecule thereof and/or a photosensitive material having a structure represented by the following formula:

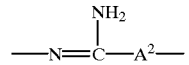

wherein $A^2$ is O, S or N atom, in the molecule thereof is suitable for formation of a positive tone pattern excellent in heat resistance, and applicable to electronic devices.

7 Claims, 3 Drawing Sheets

PHOTOSENSITIVE RESIN COMPOSITION, METHOD FOR FORMING PATTERN THEREFROM, ELECTRONIC DEVICES PRODUCED BY USING THE SAME, AND METHOD FOR PRODUCTION THEREOF

TECHNICAL FIELD

The present invention relates to a positive tone photosensitive resin composition excellent in heat resistance, a method for producing a pattern thereof, an electronic device using the same, and a method for producing the electronic device.

BACKGROUND ART

Photosensitive heat-resistant materials are useful as an interlayer insulating film and a passivation film of LSI, etc.

Polyimide which is a heat-resistant material is practically in use as an insulating film or a passivation film of LSI and the like because it can be formed into a film more easily than inorganic materials and it is low in dielectric constant and rich in toughness.

Formation of a pattern from polyimide involves a step of coating photoresist and a step of stripping it off, which make the process quite complicated. Further, transfer of a relief pattern via resist is accompanied by a drop in dimensional accuracy. Thus, in order to simplify the step of fine processing and enhance the accuracy thereof, it has been desired to develop a heat-resistant material which can directly be subjected to a fine processing by the use of light.

As for the material for the purpose mentioned above, a variety of materials have so far been proposed in the field of negative tone photosensitive materials. However, since many of the negative tone photosensitive materials use a crosslinking reaction, a swelling of light-exposed portion takes place in a developing solution, which is disadvantageous for the practice of fine processing of high resolution. Further, some processes require to use a positive type photosensitive material. For these reasons, a positive tone photosensitive material has been desired.

Further, from the viewpoint of prevention of environmental pollution and improvement of working environment, a photosensitive resin composition developable with an alkaline aqueous solvent and capable of replacing the prior photosensitive resin compositions using a developing solution of chlorinated solvent type or organic solvent type has been desired.

Positive tone photosensitive heat-resistant materials developable with an alkaline aqueous solvent can be classified into those prepared by introducing photosensitive groups into a polyamic acid through intermediation of covalent bond and those prepared by adding a photosensitive material to a polyamic acid.

As the former, photosensitive nitrobenzyl ester of polyamic acid (JP-B-1-59571) can be referred to. As the latter, the photosensitive heat-resistant material comprising polyamic acid and an orthoquinonediamide-sulfonic ester derivative (JP-A-4-168441, JP-A-4-204738), the photosensitive heat-resistant material comprising a polyamic acid and dihydropyridine derivative (JP-A-6-43648), the photosensitive heat-resistant material comprising polyamic acid and a diazidonaphthoquinonesulfonimide derivative, etc. can be referred to.

From the viewpoint of the kind of polyamic acid applicable and the easiness of preparation of photosensitive resin, those prepared by adding a photosensitive material are considered more advantageous than the other ones.

Polyamic acid has a very high dissolution rate in alkaline developing solution. Accordingly, for making a polyamic acid photosensitive, it is necessary to use a photosensitive material having a high dissolution-inhibiting effect or to lower the dissolution rate of polyamic acid.

Since prior orthoquinonediazides are mainly photosensitive materials for novolak type resist, they hardly exercise a dissolution-inhibiting effect on carboxyl group-containing polymers. Accordingly, in the photosensitive resins using a carboxyl group-containing polymer such as polyamic acid or the like and an orthoquinonediazide, the dissolution-inhibiting effect of unexposed portion and the dissolution-promoting effect of exposed portion are both small, so that sensitivity, resolution and aspect ratio are all insufficient.

Since orthoquinonediazide which is a photosensitive material for novolak type resist hardly exercises a dissolution-inhibiting effect on polyamic acid as mentioned above, polyamic acid/polyamic acid ester copolymer (JP-A-4-204738), polyamic acid ester having carboxyl groups in the diamine parts (JP-A-4-168441), etc. are used for lowering the dissolution rate of polyamic acid. These materials, however, are small in the dissolution-inhibiting effect of the unexposed portion and dissolution-promoting effect of the exposed portion and unsatisfactory in resolution, sensitivity and aspect ratio, so that no sufficient relief pattern can be obtained therefrom.

On the other hand, some of the orthoquinonediazide compounds having urea linkage are referred to as photosensitive materials. As examples thereof, positive tone photosensitive resins comprising a novolak resin (JP-A-4-274431) and positive tone photosensitive resins comprising an acrylic acid resin (JP-A-4-345164) can be referred to. However, these photosensitive resins are low in heat-resistance and not applicable to the passivation film and interlayer insulating film of LSI aimed at in the present invention.

It is an object of the present invention to solve the above-mentioned problems by providing a positive tone photosensitive resin composition high in the dissolution-inhibiting effect of the unexposed portion and dissolution-promoting effect of the exposed portion, excellent in resolution, sensitivity and aspect ratio, capable of giving a satisfactory relief patter and heat-resistance of the thus formed pattern, and suitable for use as passivation film and interlayer insulating film for LSI, and a method for forming a pattern using said composition.

It is another object of the present invention to provide an electronic device obtained by forming a pattern from said positive tone photosensitive resin composition, and a method for production of said device.

DISCLOSURE OF THE INVENTION

Essentiality of the present invention achieving the objects mentioned above is as follows:

(1) A photosensitive resin composition characterized by comprising a polyimide precursor, a photosensitive material having in the molecule thereof a structure represented by formula [1]:

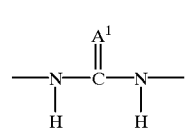

(1)

wherein $A^1$ is an atom belonging to Group VI of the periodic table, and/or a photosensitive material having in the molecule thereof a structure represented by formula [2]:

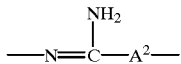
(2)

wherein $A^2$ is oxygen atom, sulfur atom or nitrogen atom.

(2) The photosensitive resin composition described in Paragraph (1), wherein said polyimide precursor is a polyimide precursor having a carboxyl group, a phenolic hydroxyl group, an amido group or a sulfonamido group.

(3) The photosensitive resin composition described in Paragraph (2), wherein said polyimide precursor is a polyimide precursor having a carboxyl group.

(4) The photosensitive resin composition described in Paragraph (1), wherein said polyimide precursor is a polyamic acid containing a recurring unit represented by general formula [3]:

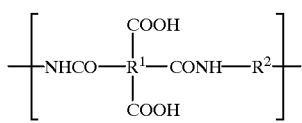
(3)

wherein $R^1$ is a tetravalent organic group and $R^2$ is a divalent organic group, in a proportion of 5 to 100% by mole and a recurring unit represented by general formula [4]:

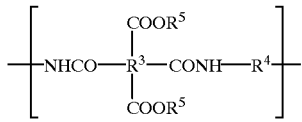
(4)

wherein $R^3$ is a tetravlent organic group, $R^4$ is a divalent organic group and $R^5$ is a monovalent organic group, in a proportion of 95 to 0% by mole.

(5) The photosensitive resin composition described in Paragraph (1), wherein said polyimide precursor is a polyamic acid ester containing a recurring unit represented by general formula [5]:

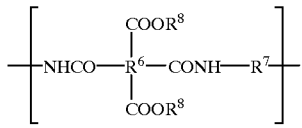
(5)

wherein $R^6$ is a tetravlent organic group, $R^7$ is a divalent organic group having a phenolic hydroxyl group, a carboxyl group, an amido group or a sulfonamido group and $R^8$ is a monovalent organic group, in a proportion of 5 to 100% by mole and a recurring unit represented by general formula [6]:

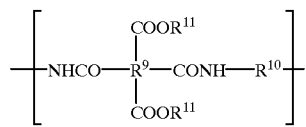
(6)

wherein $R^9$ is a tetravalent organic group, $R^{10}$ is a divalent organic group and $R^{11}$ is a monovalent organic group, in a proportion of 95 to 0% by mole.

(6) The photosensitive resin composition described in Paragraph (1), wherein said polyimide precursor is a polyamic acid containing a recurring unit represented by general formula [7]:

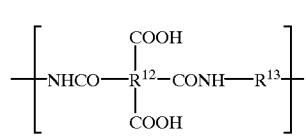
(7)

wherein $R^{12}$ is a tetravalent organic group and $R^{13}$ is a divalent organic group, in a proportion of 5 to 100% by mole and a recurring unit represented by general formula [8]:

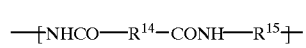
(8)

wherein $R^{14}$ is a divalent organic group having no ester linkage in the side chain thereof and $R^{15}$ is a divalent organic group, in a proportion of 95 to 0% by mole.

(7) The photosensitive resin composition described in Paragraph (6), wherein said polyamic acid has a carboxyl group concentration of 2.6 mmol/g or less and a sulfone group concentration of 1.25 mmol/g or above.

(8) The photosensitive resin composition described in any one of Paragraphs (1) to (7), wherein said photosensitive material is an orthoquinonediazide compound.

(9) The photosensitive resin composition described in Paragraph (1), wherein said photosensitive material is a compound represented by general formula [9]:

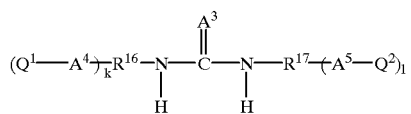
(9)

wherein $Q^1$ and $Q^2$ each independently represents an orthoquinonediazido-sulfonyl group, $A^3$ is an atom belonging to Group VI of the periodic table, $A^4$ and $A^5$ each independently represents oxygen atom or imino group, $R^{16}$ and $R^{17}$ each independently represents a hydrocarbon group having 2 to 30 carbon atoms or a heterocyclic group, and k and l each independently represents an integer of 1 to 5.

(10) The photosensitive resin composition described in Paragraph (1), wherein said photosensitive material is a compound represented by general formula [10]:

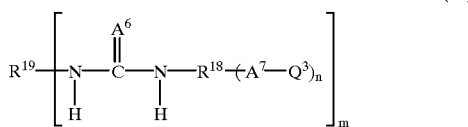

wherein $Q^3$ is orthoquinonediazido-sulfonyl group, $A^6$ is an atom belonging to Group VI of the periodic table, $A^7$ is oxygen atom or imino group, $R^{18}$ is a (n+1)-valent hydrocarbon group having 2 to 30 carbon atoms or a heterocyclic group, $R^{19}$ is an m-valent hydrocarbon group having 2 to 30 carbon atoms or a heterocyclic group, m is an integer of 1 to 10, and n is an integer of 1 to 5.

(11) The photosensitive resin composition described in Paragraph (1), wherein said photosensitive material is a compound represented by general formula [11]:

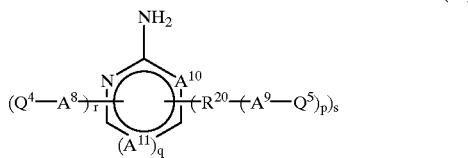

wherein $Q^4$ and $Q^5$ each independently represents orthoquinonediazido-sulfonyl group, $A^8$ and $A^9$ each independently represents oxygen atom or imino group, $A^{10}$ represents oxygen atom, sulfur atom, nitrogen atom or imino group, $A^{11}$ represents nitrogen atom, carbon atom or CH, $R^{20}$ represents a (p+1)-valent hydrocarbon group having 2 to 30 carbon atoms or a (p+1)-valent heterocyclic group, the substituent represented by $-A^8-Q^4$ or $-(-R^{20}-(-A^9-Q^5)_p)$ is linked to $A^{11}$ or a carbon atom adjacent to $A^{11}$, s and r each independently represents an integer of 0 to 5, s+r is equal to 1 to 5, p represents an integer of 1 to 5, and q represents an integer of 0 to 5.

(12) A method for forming a pattern characterized by comprising a step of coating the photosensitive resin composition described in any of Paragraphs (1) to (11) onto a substrate and drying the coating, a step of irradiating an electromagnetic wave through intermediation of a photomask, and a step of developing the photosensitive resin composition with an alkaline developing solution.

(13) A method for producing an electronic device characterized by comprising a step of coating the photosensitive resin composition described in any of Paragraphs (1) to (11) onto a circuit-forming surface or protective film-forming surface of an electronic device and drying the coating, a step of irradiating an electromagnetic wave through intermediation of a photomask, and a step of developing the photosensitive resin composition with an alkaline developing solution and thereby forming a pattern.

(14) An electronic device having a resin film on a circuit-forming surface or protective film-forming surface thereof, characterized in that said resin film is obtained from a pattern formed by coating a photosensitive resin composition described in any of Paragraphs (1) to (11) and drying the coating, irradiating an electromagnetic wave through intermediation of a positive type photomask and then developing the resin composition with an alkaline developing solution.

BEST MODE FOR CARRYING OUT THE INVENTION

Figure 1A:
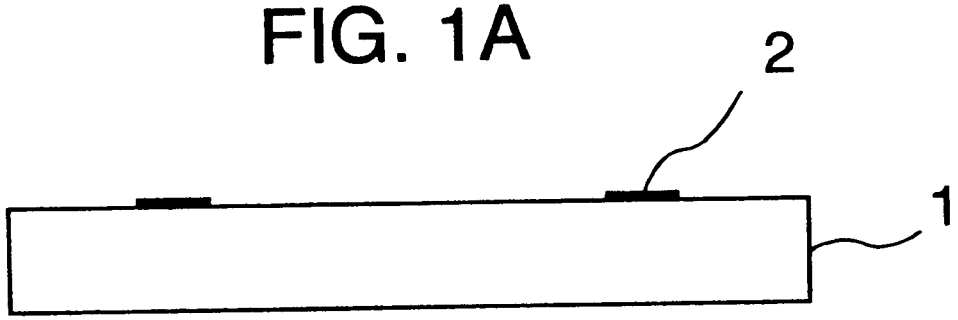
FIGS. 1A to 1C are schematic sectional views illustrating a process for forming a buffer coat film using the photosensitive resin composition of the present invention.

The photosensitive material used in the present invention functions as a photo-dissolution controller of a polyimide precursor.

The photosensitive material used in the present invention has a structure represented by formula (1) or (2). Having functional groups (dissolution-inhibiting sites) capable of forming a hydrogen bonding with two moles of functional groups such as carboxyl group or the like in a polyimide precursor, the photosensitive material of the invention exhibits an especially marked effect of inhibiting the dissolution of unexposed area.

When the photosensitive resin composition of the present invention is irradiated with an electromagnetic wave, the composition forms carboxyl group or the like having a high polarity, and thereby the dissolution-inhibiting effect thereof on the polyimide precursor having carboxyl group or the like is eliminated and solubility of the polyimide precursor having carboxyl group or the like in alkaline solutions is improved, as a result of which a positive image is obtained.

In the present invention, an orthoquinonediazide compound capable of taking part in a strong interaction with carboxyl group of polymers is used as a photosensitive material, which is desirable because thereby a positive tone photosensitive resin composition of excellent heat resistance, high sensitivity and high aspect ratio can be realized.

Since the present invention is a combination of a polyimide precursor and a photosensitive material containing an prescribed structure represented by formula [1] or [2], the composition can be converted to a polyimide film excellent in heat resistance and chemical resistance by formation of a relief image followed by a thermal or chemical imidization. Accordingly, the composition of the invention can be used for a passivation film of LSI or an interlaminar insulation film having a relief image.

The present invention utilizes the high dissolution-inhibiting effect of the structure represented by formula [1] or [2] on the polyimide precursor. Accordingly, position of the photosensitive site in the photosensitive material to be combined with polyimide precursor is not particularly limited, so far as the photosensitive material has a structure represented by formula [1] or [2]. However, it is preferable that the photosensitive site contains an orthoquinonediazido group, because a positive tone photosensitive resin composition of excellent heat resistance, high sensitivity and high aspect ratio can be realized when the photosensitive material is an orthoquinonediazide compound, as has been mentioned above.

In formula [1], $A^1$ is an atom belonging to Group VI of the periodic table, and such an atom can form a hydrogen bonding with two hydrogen atoms of carboxyl group. As such atoms, oxygen atom, sulfur atom, selenium atom, tellurium atom, etc. can be referred to. As concrete structures of the dissolution-inhibiting site thereof, urea linkage, thiourea linkage, etc. can be referred to.

As photosensitive material having the structure of formula [1], compounds represented by the following general formula [1'] can be referred to:

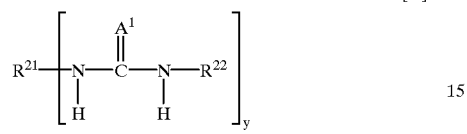

wherein $A^1$ is an atom belonging to Group VI of the periodic table, $R^{21}$ is a y-valent organic group, $R^{22}$ is a monovalent organic group, y is an integer of 1 to 10, and at least one member selected from said $R^{21}$ and said groups represented by $R^{22}$ existing in a number of y has a photosensitive group.

As the monovalent organic group represented by $R^{21}$ and $R^{22}$ and having no photosensitive group, there can be referred to hydrocarbon group such as alkyl groups having 1 to 50 carbon atoms (e.g. propyl group, butyl group and the like), aryl groups having 6 to 50 carbon atoms (e.g. phenyl group, naphthyl group and the like), aralkyl groups having 7 to 50 carbon atoms (e.g. benzyl group and the like) and alicyclic hydrocarbon groups having 4 to 50 carbon atoms (e.g. cyclohexyl group and the like), heterocyclic groups, groups formed by combining a plurality of the above-mentioned hydrocarbon groups or heterocyclic groups via amide linkage, ester linkage, urethane linkage, ether linkage, thioether linkage, amino linkage, sulfone linkage or the like, and groups formed by replacing hydrogen atom of the above-mentioned groups with a variety of substituents such as halogen atom or the like.

When a plurality of the organic groups represented by $R^{22}$ are present (namely, when y is 2 or greater), the plurality of groups may be identical or different from one another.

The group $R^{21}$ is a y-valent group. That is, $R^{21}$ has a valence of 2 or greater when y is 2 or greater. As such groups, there can be referred to aromatic hydrocarbon groups having 6 to 50 carbon atoms, acyclic aliphatic hydrocarbon groups having 1 to 50 carbon atoms, alicyclic hydrocarbon groups having 4 to 50 carbon atoms, heterocyclic groups, groups formed by combining a plurality of the above-mentioned groups via a linkage such as amide linkage, ester linkage, urethane linkage, ether linkage, thioether linkage, amino linkage, sulfone linkage or the like, groups formed by replacing hydrogen atom of the above-mentioned groups with a variety of substituents such as halogen atom or the like, etc.

As the organic groups represented by $R^{21}$ and $R^{22}$ and having a photosensitive group, those formed by replacing at least one of the hydrogen atoms of the aforementioned organic groups having no photosensitive group with a substituent containing a photosensitive group can be referred to. As such a photosensitive group, preferred are the groups generating an acid by the action of light such as groups having a 2-diazoketone structure:

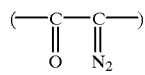

and especially preferred are groups having a naphthoquinonediazide structure such as the structures of the following formulas:

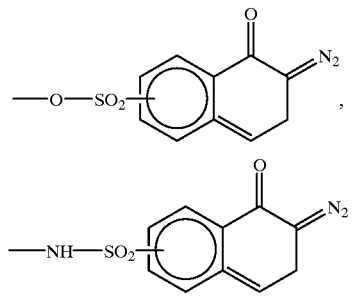

As photosensitive materials having a structure of the above-mentioned formula [2], there can be referred to compounds represented by the following general formula [2']:

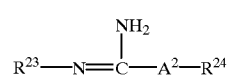

wherein $R^{23}$ and $R^{24}$ each independently represents an organic group, $A^2$ represents oxygen atom, sulfur atom or nitrogen atom, and at least one of $R^{23}$ and $R^{24}$ has a photosensitive group, or the following general formula [2"]:

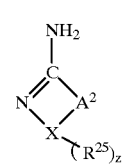

wherein X represents a group consisting of 1 to 7 atoms selected from carbon atom, nitrogen atom, sulfur atom and oxygen atom and constituting a 4- to 10-membered ring together with $-N=C-A^2-$, provided that all the atoms constitute the ring, and groups represented by $R^{25}$ are linked to this group X through covalent bonds, provided that the number of the groups $R^{25}$ is a number necessary for filling up all the bonding orbitals of X, $A^2$ is oxygen atom, sulfur atom or nitrogen atom, $R^{25}$ is hydrogen atom or monovalent organic groups linked to the atom represented by X, z is an integer of 1 to 14, and at least one of $R^{25}$ has a photosensitive group.

As $R^{23}$ and $R^{24}$, organic groups having 1 to 50 carbon atoms are preferred, of which examples are the same as above-mentioned examples of the group represented by $R^{21}$.

X forms a 4- to 10-membered ring together with $-N=C-A^2-$, and the ring thus formed may be any of aromatic ring and non-aromatic ring. As concrete examples of the ring, the aromatic rings present in pyrimidine, oxazole, thiazole, imidazole and the like can be referred to.

$R^{25}$ is preferably hydrogen atom or an organic group having 1 to 50 carbon atoms, and examples thereof are the same as the above-mentioned examples of the group represented by $R^{21}$. In case where a plurality of groups $R^{25}$ are present, the groups $R^{25}$ may be identical or different from one another.

As the photosensitive material having a structure represented by formula [1] or [2], those represented by general formula [9] and [10] and general formula [11] are more preferable.

In general formula [9], $A^3$ is an atom belonging to Group VI of the periodic table, and it is an atom capable of forming a hydrogen bonding with two hydrogen atoms of carboxyl group. As such atoms, oxygen atom, sulfur atom, selenium atom and tellurium atom can be referred to.

In general formula [9], $Q^1$ and $Q^2$ represent an orthoquinonediazido-sulfonyl group. The orthoquinonediazido group forms a carboxyl group of high polarity when irradiated with an electromagnetic wave and thereby improves solubility of the carboxyl group-carrying polymer in an alkali solution.

As the orthoquinonediazido-sulfonyl group, 1,2-naphthoquinone-2-diazido-4-sulfonyl group, 1,2-naphthoquinone-2-diazido-5-sulfonyl group are preferred.

The dissolution-promoting effect brought about by exposure to light is much influenced by the ratio between the dissolution-inhibiting site and the photosensitive group such as orthoquinonediazido group in the photosensitive material. Accordingly, in general formula [9], k and l are integers of 1 to 5, and preferably 1 to 2.

$A^4$ and $A^5$ each represents a linker between orthoquinonediazido-sulfonyl group and $R^{16}$ and $R^{17}$. As said linker, oxygen atom or imino group can be referred to.

$R^{16}$ and $R^{17}$ are groups linking a photosensitive group consisting of orthoquinonediazido-sulfonyl group and an oxygen atom or an imino group to the structure represented by formula [1], and it is a hydrocarbon group such as aliphatic hydrocarbon group having 2 to 30 carbon atoms, aromatic hydrocarbon group, alicyclic hydrocarbon group and the like or a heterocyclic group.

The photosensitive material represented by general formula [9] can be obtained, for example, by reacting orthoquinonediazido-sulfonic acid chloride with a compound in which two hydroxyl group-carrying groups are linked to each other via a urea linkage such as a compound of the following formula:

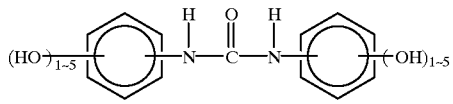

In general formula [10], $A^6$ is an atom belonging to Group VI of the periodic table, which can form a hydrogen bonding with two hydrogen atom of carboxyl group. As such atoms, oxygen atom, sulfur atom, selenium atom and tellurium atom can be referred to.

In general formula [10], $Q^3$ represents an orthoquinonediazido-sulfonyl group. As the orthoquinonediazido-sulfonyl group, 1,2-naphthoquinone-2-diazido-4-sulfonyl group and 1,2-naphthoquinone-2-diazido-5-sulfonyl group are preferred.

The dissolution-promoting effect after the exposure to light is much influenced by the ratio between the dissolution-inhibiting site and the photosensitive group such as orthoquinonediazido group and the like in the photosensitive material. Accordingly, in general formula [10], n is an integer of 1 to 5 and preferably 1 to 2. If the dissolution-inhibiting effect exercised by the dissolution-inhibiting site on the unexposed area is taken into consideration, m is an integer of 1 to 10 and preferably 1 to 5.

$A^7$ represents a linker between orthoquinonediazido-sulfonyl group and $R^{18}$. As the linker, oxygen atom or imino group can be referred to.

$R^{18}$ is a group linking a photosensitive group consisting of orthoquinonediazido-sulfonyl group and oxygen atom or imino group to the structure represented by the above-mentioned formula [1], and it is a hydrocarbon group such as (n+1)-valent aliphatic hydrocarbon group having 2 to 30 carbon atoms, aromatic hydrocarbon group, alicyclic hydrocarbon group and the like or a heterocyclic group. $R^{19}$ is a m-valent hydrocarbon group having 2 to 30 carbon atoms or a heterocyclic group.

It is preferable that the compound of general formula [10] contains the structure represented by formula [1] in a number of 1 or 2. If the structure [1] is present in an excessively large number, the dissolution-inhibiting effect is too strong and the development after exposure to light tends to be difficult to practice. The orthoquinonediazido-sulfonyl group is preferably present in a number of 1 or 2. If this structure is present in an excessively large number, sensitivity tends to decrease.

The photosensitive material represented by general formula [10] is obtained by, for example, reacting orthoquinonediazido-sulfonic acid chloride with an aminoalcohol or an amine having two or more amino groups to obtain a reaction product having an amino group and an orthoquinonediazido-sulfoxy group or an orthoquinonediazido-sulfonamido group, and then reacting the reaction product with an isocyanate compound.

As the aminoalcohol, 2-aminophenol, 3-aminophenol, 4-aminophenol, 2,3-diaminophenol, 2,4-diaminophenol, 4-aminoresorcinol, 4,4'-diamino-3,3'-dihydroxybiphenyl, 3,3'-diamino-4,4'-dihydroxybiphenyl, 2-aminoethanol, N-methyl-2-aminoethanol, 3-aminopropanol, 2-aminobutanol, 2-amino-3-methylbutanol, 4-aminobutanol, 5-aminopentanol, 6-aminohexanol, 4-aminocyclohexanol, 2-aminoheptanol, 6-amino-2-methyl-2-heptanol, 8-aminooctanol, 10-aminodecanol, 12-aminododecanol, 1-amino-2,3-propanediol, 2-amino-1,3-propanediol, 2-amino-2-ethyl-1,3-propanediol, bis-homo-tris,tris(hydroxymethyl)aminomethane and the like can be referred to.

As the amine having two or more amino groups, 1,3-diaminobenzene, 1,4-diaminobenzene, 4,4'-diaminobiphenyl, 4,4'-diaminodiphenylmethane, 4,4'-diaminodiphenyl ether, 4,4'-diaminodiphenyl ketone, 4,4'-diaminodiphenyl sulfone, 2,2-bis(4-aminophenyl)propane, 2,2-bis(4-aminophenyl)-1,1,1,3,3,3-hexafluoropropane, bis(3-aminopropyl)-tetramethyldisiloxane, 1,2,4-triaminobenzene-1,3,5-triaminobenzene, 3,4,4'-triaminodiphenyl ether, 3,3',4,4'-diaminobiphenyl, 3,3',4,4'-tetraaminodiphenyl ether, 3,3',4,4'-tetraaminodiphenyl sulfone, 1,2-diaminoethylene, N,N'-dimethyl-1,2-diaminoethylene, 1,3-diaminopropane, 1,4-diaminobutane, N,N'-dimethyl-1,4-diaminobutane, 1,6-diaminohexane, 1,8-diaminooctane, 1,10-diaminodecane, 1,12-diaminododecane, 2-butyl-2-ethyl-1,5-pentanediamine, 4-aminomethyl-1,8-diaminooctane, diethylenetriamine, bis(hexamethylene)triamine, triethylenetetramine, tetraethylenepentamine and the like can be referred to.

In general formula [10], $R^{19}$ is a residue of the isocyanate compound conventionally used as a starting compound. As the isocyanate compound, ethyl isocyanate, propyl isocyanate, butyl isocyanate, t-butyl isocyanate, hexyl isocyanate, cyclohexyl isocyanate, octyl isocyanate, dodecyl isocyanate, 1-adamantyl isocyanate, phenyl isocyanate, 1-phenylethyl isocyanate, benzyl isocyanate, 1-naphthylethyl isocyanate, 2,6-diisopropylphenyl isocyanate, 1-biphenyl isocyanate, 1,4-diisocyanatobutane, 1,6-diisocyanatohexane, 1,4-cyclohexane diisocyanate, 1,3-bis(isocyanatomethyl)-cyalohexane, isophorone diisocyanate, 4,4'-methylenebis(cyclohexylisocyanate), 1-(1-naphthyl)ethyl isocyanate, 1,3-phenylene isocyanate, toluylene-2,4-diisocyanate, 4,4'-methylenebis-(phenylisocyanate), 4,4'-methylenebis(2,6-diethylphenyl-isocyanate), and the like can be referred to.

In general formula [11], $A^{10}$ is an atom capable of forming a hydrogen bonding with one hydrogen atom of carboxyl group. As such an atom, oxygen atom, sulfur atom and imino group can be referred to. In a case where q is 2 or greater, the plurality of groups represented by $A^{11}$ may be identical or different from one another. However, in a case where q is 2 or greater, it is preferable that all the groups represented by $A^{11}$ are carbon atom or CH. As concrete compounds having a concrete structure of general formula [11], the following can be referred to:

2-aminopyrimidine compounds represented by:

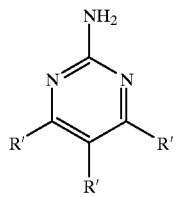

2-aminooxazole compounds represented by:

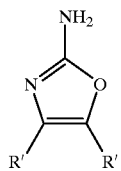

2-aminothiazole compounds represented by:

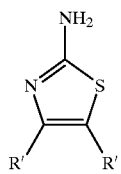

2-aminoimidazole compounds represented by:

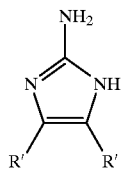

and melamine compounds represented by:

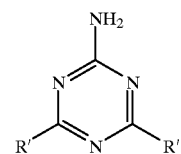

In all the formulas shown above, the plurality of groups represented by R' each independently represents hydrogen atom or —$A^8$—$Q^4$ or —$R^{20}$—(—$A^9$—$Q^5$), provided that at least one of the groups represented by R' is —$A^8$—$Q^4$ or —$R^{20}$—(—$A^9$—$Q^5$).

In general formula [11], $Q^4$ and $Q^5$ represent orthoquinonediazido-sulfonyl group. As the orthoquinonediazido-sulfonyl group, 1,2-naphthoquinone-2-diazido-4-sulfonyl group and 1,2-naphthoquinone-2-diazido-5-sulfonyl group are preferred.

The dissolution-promoting effect after exposure to light is much influenced by the ratio between the dissolution-inhibiting site and the photosensitive group such as ortho-quinonediazido group or the like in the photosensitive material. Accordingly, in general formula [11], p is an integer of 1 to 5 and preferably 1 to 2, and s+r is an integer of 1 to 5 and preferably 2 to 4.

$A^8$ and $A^9$ represent a linker between orthoquinonediazido-sulfonyl group and $R^{20}$ or the ring. As such a linker, oxygen atom and imino group can be referred to.

$R^{20}$ is a group linking the photosensitive group consisting of orthoquinonediazido-sulfonyl group and oxygen atom or imino group to the aromatic ring having a structure represented by formula [2], and it is a hydrocarbon group such as aliphatic hydrocarbon group having 2 to 30 carbon atoms, aromatic hydrocarbon group, alicyclic hydrocarbon group or the like or a heterocyclic group.

The compound of general formula [11] preferably contains the orthoquinonediazido group in a number of 1 or 2. If the number of this structure is too large, sensitivity tends to decrease.

The photosensitive material represented by general formula [11] can be obtained by, for example, reacting orthoquinonediazido-sulfonic acid chloride with the hydroxyl group of a compound represented by the following general formula [11']:

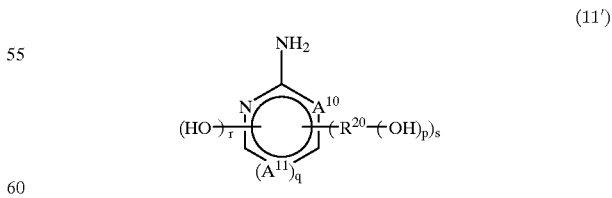

(11')

wherein meanings of the symbols in this formula are the same as those in general formula [11].

Next, concrete examples of the photosensitive material represented by general formulas [9], [10] and [11] are shown below:

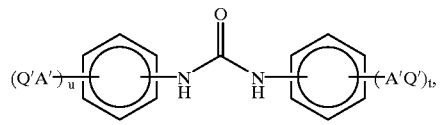
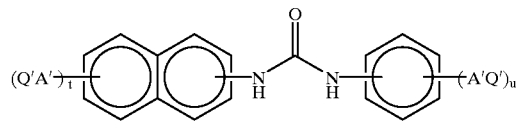

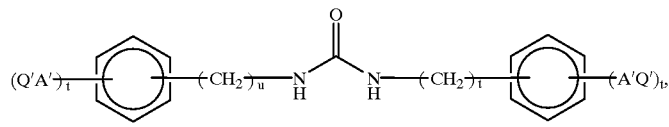

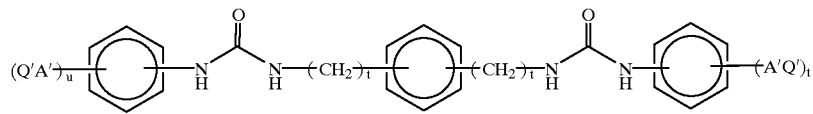

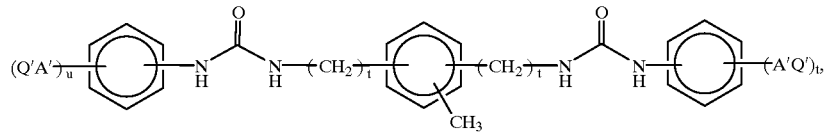

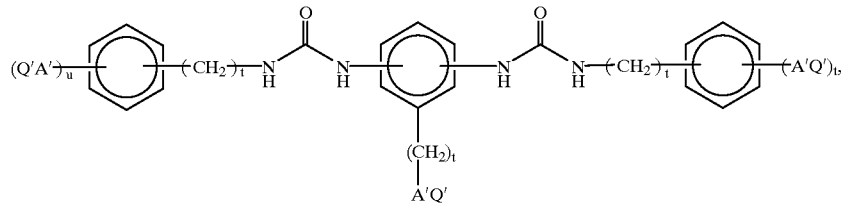

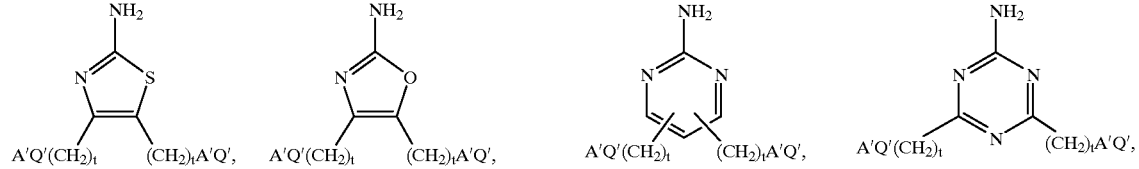

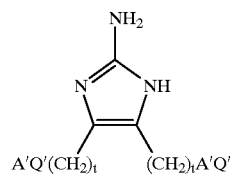

In the structural formulas shown above, A' is O or NH, Q' is a group of the following formula:

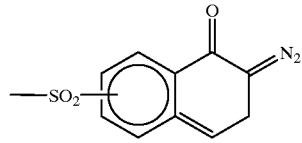

u is an integer of 1 to 5, and t is an integer of 0 to 5, provided that each formula contains at least one A'Q'.

As more concrete Examples of the compounds, those mentioned in the examples described later can be referred to, in addition to which the following compounds can also be referred to as preferable ones:

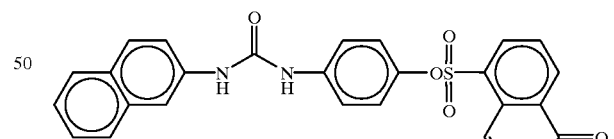

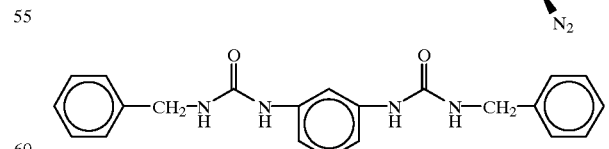

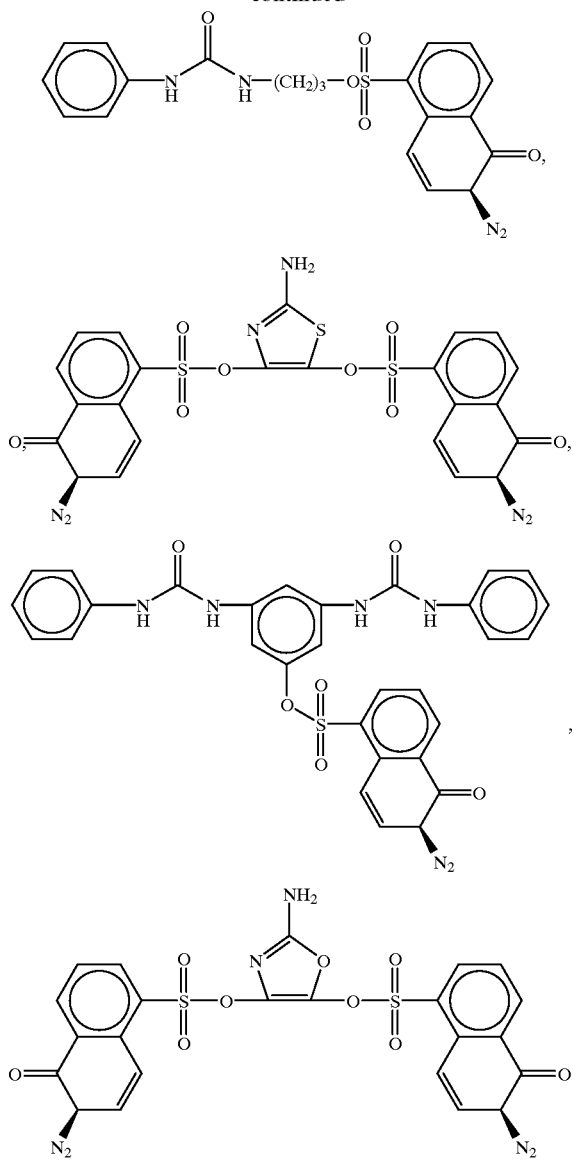

In the photosensitive resin composition of the present invention, the above-mentioned photosensitive materials are added preferably in an amount of 1 to 100 parts by weight and more preferably in an amount of 10 to 50 parts by weight per 100 parts by weight of the total resin quantity contained in the composition. If the amount of the photosensitive material is smaller than 1 part by weight, dissolution-inhibiting effect is small and sensitivity and resolution tend to be insufficient. If the amount of the photosensitive material exceeds 100 parts by weight, the film tends to be brittle and insufficient in adhesiveness to substrate.

The photosensitive resin composition of the present invention contains a polyimide precursor as a resin ingredient. As the polyimide precursor, polyamic acid, polyamic acid ester, polyamic acid amide, partially imidized products thereof and the like can be referred to. The polyimide precursors used in the present invention usually contain a carboxyl group, a phenolic hydroxyl group, an amido group or a sulfonamido group for the purpose of making the composition an alkali-developable positive tone photosensitive resin composition. Among them, those containing carboxyl group are preferable, because a combination of such a polyimide precursor and the above-mentioned photosensitive material exhibits a high dissolution-inhibiting effect.

Since the present invention uses the polyimide precursor in the form of a resin, a relief image excellent in heat resistance and chemical resistance can be obtained by converting the precursor to a polyimide through formation of a relief image followed by a thermal or chemical imidization. The use of a polyamic acid which is a polycondensation type polymer having a recurring unit represented by general formula [3] or having the recurring units of general formulas [3] and [4] or the use of a polyamic acid ester which is a polycondensation type polymer having a recurring unit represented by general formula [5] or having recurring units represented by general formulas [5] and [6] is especially preferable, because a relief image of high resolution can be obtained thereby. This makes it possible to exhibit excellent performance as a protective film of LSI or an insulating film of wiring substrate.

The weight average molecular weight of the polyimide precursor is preferably 10,000 or above, when solubility in modifying solution and mechanical characteristics of relief pattern are taken into consideration. Although the upper limit of weight average molecular weight is not particularly limited, the upper limit is preferably not higher than 1,000,000, when solubility in solvents, easiness of handling as a photosensitive varnish and solubility in developing solution are taken into consideration. The weight average molecular weight can be determined by a gel permeation chromatographic measurement followed by calculation using a calibration curve for standard polystyrene.

In the recurring units represented by general formulas [3] to [6], $R^1$, $R^3$, $R^6$ and $R^9$ each represents a tetravalent organic group. More concretely saying, they each represents an aliphatic hydrocarbon group having 2 to 50 carbon atoms, an aromatic hydrocarbon group, a heterocyclic group, an organic group having 2 to 50 carbon atoms in the total formed by linking together a plurality of these groups via polyvalent linking group selected from oxygen atom, sulfur atom, methylene, amine, carbonyl, sulfone, ester, sulfonic ester, amido, sulfonamido, urea, carbonate, and carbamate, a group formed by replacing a hydrogen atom of these groups with a substituent such as halogen atom or the like, etc.

$R^1$, $R^3$, $R^6$ and $R^9$ each represents a residue of an aliphatic or aromatic tetracarboxylic acid or a derivative thereof conventionally used as a starting material of polyimide precursor.

As said tetracarboxylic acid or derivative thereof, there can be referred to pyromellitic acid, 3,3',4,4'-tetracarboxybiphenyl, bis(3,4-dicarboxyphenyl)ketone, bis(3,4-dicarboxylphenyl)ether, bis(3,4-dicarboxyphenyl)sulfone, 2,2-bis(3,4-dicarboxyphenyl)-1,1,1,3,3,3-hexafluoropropane, 4,4'-(3,4-dicarboxybenzoyl)-biphenyl, 2,2-bis[4-(3,4-dicarboxybenzoyl)-3-methylphenyl]-propane, 1,1-bis[4-(3,4-dicarboxybenzoyl)-3-methylphenyl]-1-phenylethane, bis[4-(3,4-dicarboxybenzoyl)phenyl]sulfone, bis[4-(3,4-dicarboxybenzoyl)phenyl]ketone, bis[4-(3,4-dicarboxybenzamino)phenyl]sulfone and the like and dianhydrides thereof.

$R^2$, $R^4$ and $R^{10}$ each represents a divalent organic group, of which concrete examples include aliphatic hydrocarbon groups having 2 to 50 carbon atoms, aromatic hydrocarbon groups, heterocyclic groups, organic groups having 2 to 50 carbon atoms in the total formed by linking a plurality of the above-mentioned groups via a polyvalent linking group selected from oxygen atom, sulfur atom, methylene, amine, carbonyl, sulfone, ester, sulfonic ester, amido, sulfonamido, urea, carbonate and carbamate, groups formed by further replacing hydrogen atom of these groups with a substituent such as halogen atom or the like, groups having a structure of polysiloxane, and the like.

$R^2$, $R^4$ and $R^{10}$ are a residue of a diamine such as aliphatic diamine or aromatic diamine conventionally used as a starting material of polyimide precursor.

As said diamine, there can be referred to 1,4-diaminobenzene, 1,3-diaminobenzene, 4,4'-diaminobiphenyl, 4,4'-diaminodiphenylmethane, 4,4'-diaminodiphenyl ether, 4,4'-diaminodiphenyl ketone, 4,4'-diaminodiphenyl sulfone, 2,2-bis(4-aminophenyl)propane, 2,2-bis(4-aminophenyl)-1,1,1,3,3,3-hexafluoropropane, bis(3-aminopropyl)-tetramethyldisiloxane, 4,4'-diamino-2,2'-dimethylbiphenyl, 1,3-bis(4-aminophenoxy)benzene, 2,2-bis[4-(4-aminophenoxy)phenyl]propane and the like.

In general formula [5], $R^7$ represents a divalent organic group having phenolic hydroxyl group, carboxyl group, amido group or sulfonamido group, of which concrete examples include aliphatic or aromatic hydrocarbon groups having 2 to 20 carbon atoms such as aryl group, aralkyl group and alkyl group, and heterocyclic groups and the like with phenolic hydroxyl group, carboxyl group, amido group or sulfonamido group linked thereto. This group is usually a residue of a diamine having phenolic hydroxyl group, carboxyl group, amido group or sulfonamido group.

As said diamine, there can be referred to 3,5-diaminophenol, 3,3'-diamino-4,4'-dihydroxybiphenyl, 4,4'-diamino-3,3'-dihydroxybiphenyl, 3,3'-diamino-4,4'-dihydroxydiphenyl ether, 3,5-diaminobenzoic acid, 3,5-diaminosulfoneamide, 3,5-diaminobenzamide, 3,5-diaminosulfonamide and the like.

In general formula [4] to [6], $R^5$, $R^8$ and $R^{11}$ represent a monovalent organic group. Concretely, alkyl groups having 1 to 20 carbon atoms, aryl groups, aralkyl groups, heterocyclic groups and the like are preferable.

In the present invention, for the purpose of adjusting solubility of polyimide precursor in alkali solution to an appropriate value, the constitutional ratio of the recurring unit represented by general formula [3] to the recurring unit represented by general formula [4] and the constitutional ratio of the recurring unit represented by general formula [5] to the recurring unit represented by general formula [6] are both preferably selected in a range where the former occupies 5 to 100% by mole and the latter occupies 0 to 95% by mole. If the proportion of the former is too small, dissolution rate of exposed area is low and sensitivity is also low. Accordingly, it is more preferable that the proportion of the former is 50 to 100% by mole.

When a polyamic acid not esterified partially is used, it is preferable to use those having a structure of general formula [7] and general formula [8] as the polyamic acid.

When the polyamic acid having such a structure contains no sulfone group, the swelling of film in alkali developing solution becomes more remarkable as the concentration of carboxyl group in polymer becomes lower (namely, as the molecular weight per carboxyl group becomes higher).

Thus, as the concentration of carboxyl group becomes lower, the difference between the velocity of permeation of alkali developing solution into polyamic acid film (permeation velocity) and the velocity of dissolution of the swollen layer formed as a result of the permeation (dissolution rate) becomes greater, which results in a more remarkable swelling of the film. Accordingly, in such a case, a polyamic acid film showing small swelling in alkali developing solution (small difference between permeation velocity and dissolution rate) and having an appropriate dissolution rate in alkali developing solution is difficult to obtain.

Polyamic acids having sulfone group in the main chain thereof and having a sulfone group concentration in polymer of 1.25 mmol/g or more and a carboxyl group concentration in polymer of 2.6 mmol/g or less are preferable, because such polyamic acids dissolve without swelling in alkali developing solution independently of structure thereof.

In such a case, both permeation velocity and dissolution rate of polyimide precursor film decrease as carboxyl group concentration decreases. Accordingly, there can be obtained a polyamic acid film small in the degree of swelling (difference between permeation velocity and dissolution rate) in alkali developing solution and having an appropriate dissolution rate in alkali developing solution.

If the shape of relief pattern obtained by alkali development and the time of development which are important to the process are taken into consideration, polyamic acids having a dissolution rate of 2 to 5 µm/minute in alkali developing solution are preferable. When a general alkali developing solution [aqueous solution of tetramethylammonium hydroxide (TMAH) having a concentration of 1.5% or more] is used, combinations of tetracarboxylic acid dianhydride and diamine which give a carboxyl group concentration of 2.6 mmol/g or less in the formed polyamic acid are preferable.

In the present invention, carboxyl group concentration C in polymer is defined by the following formula:

$$C = \frac{2 \times X \times 1000}{X \times Mt + (1-X) \times Mc + Md} \text{(mmol/g)}$$

In this formula, Mt is molecular weight of tetracarboxylic acid dianhydride, Mc is a value expressed by [molecular weight of dicarboxylic acid dichloride minus 73], and Md is molecular weight of diamine. X is defined by the following formula:

$X = Nt/(Nt+Nc)$ wherein Nt is mol number of tetracarboxylic acid dianhydride, and Nc is mol number of dicarboxylic acid dichloride.

In this invention, sulfone group concentration S is defined by the following formula:

$$S = \frac{[X \times St + (1-X) \times Sc + Sd] \times 1000}{X \times Mt + (1-X) \times Mc + Md} \text{(mmol/g)}$$

In this formula, St is number of sulfone group per molecule of tetracarboxylic acid dianhydride, Sc is number of sulfone group per molecule of dicarboxylic acid dichloride, Sd is number of sulfone group per molecule of diamine, and Mt, Mc, Md and X are as defined above.

The above-mentioned polyamic acid can readily be obtained by a polyaddition reaction of an acid dianhydride and a diamine.

In general formula [7], $R^{12}$ is a tetravalent organic group. Concrete examples thereof include aliphatic hydrocarbon groups having 2 to 50 carbon atoms, aromatic hydrocarbon groups, organic groups having 2 to 50 carbon atoms in the total formed by linking a plurality of these hydrocarbon groups via a polyvalent linking group selected from oxygen atom, sulfur atom, methylene, amine, carbonyl, sulfone, ester, sulfonic ester, amido, sulfonamido, urea, carbonate and carbamate, groups formed by further substituting these groups with halogen atom or the like, etc.

$R^{12}$ is a residue of aliphatic or aromatic tetracarboxylic acid or derivative thereof used conventionally as a starting material of polyimide precursor.

As such tetracarboxylic acid or derivative thereof which has a sulfone group, there can be referred to sulfonic acid dianhydrides such as bis(3,4-dicarboxyphenyl)sulfonic acid dianhydride (DS, DA), bis[4-(3,4-dicarboxybenzoyloxy) phenyl]sulfonic acid dianhydride (SOTME), bis[4-(3,4-dicarboxybenzamino)phenyl]sulfonic acid dianhydride (SOTMA), bis[4-(3,4-dicarboxyphenoxy)-phenyl]sulfonic acid dianhydride (SOPOP) and the like.

When a tetracarboxylic acid dianhydride containing no sulfone group is used, it is preferable to adjust sulfone group concentration in the main chain of the resulting polyamic acid to 1.25 mmol/g or more and the carboxyl group concentration to 2.6 mmol/g or less by, for example, combining the tetracarboxylic acid dianhydride with a diamine having sulfone group.

Concretely, there can be referred to pyromellitic acid dianhydride, 3,3',4,4'-tetracarboxybiphenyl acid dianhydride, bis[(3,4-dicarboxyphenyl)ketone acid dianhydride, bis(3,4-dicarboxyphenyl)ether acid dianhydride, 2,2-bis(3,4-dicarboxyphenyl)-1,1,1,3,3,3-hexafluoropropanoic acid dianhydride, 2,2-bis[4-(3,4-dicarboxybenzoyloxy)-3-methylphenyl]propanoic acid dianhydride, bis[4-(3,4-dicarboxybenzoyloxy)phenyl ketone acid dianhydride, 1,1-bis[4-(3,4-dicarboxybenzoyloxy)-phenyl]-1-phenylethanoic acid dianhydride, 2,2-bis[4-(3,4-dicarboxyphenoxy)phenyl] propanoic acid dianhydride, bis[4-(3,4-dicarboxyphenoxy) phenyl] ketone acid dianhydride, and the like.

In general formulas [7] and [8], $R^{13}$ and $R^{15}$ are divalent organic groups. Concretely, there can be referred to aliphatic hydrocarbon groups having 2 to 50 carbon atoms, aromatic hydrocarbon groups, organic groups having 2 to 50 carbon atoms in the total in which a plurality of the above-mentioned hydrocarbon groups are liked via a polyvalent linking group selected from oxygen atom, sulfur atom, methylene, amine, carbonyl, sulfone, ester, sulfonic ester, amido, sulfonamido, urea, carbonate and carbamate, groups formed by further substituting these groups with a substituent such as halogen atom or the like, groups having a structure of polysiloxane, and the like.

$R^{13}$ and $R^{14}$ are a residue of a diamine such as aliphatic diamine, aromatic diamine or the like conventionally used as a starting material of polyimide precursor.

As examples of said diamines having a sulfone group, there can be referred to bis(4-aminophenyl) sulfone [DDSO4], bis(3-aminophenyl) sulfone [DDSO3], bis[4-(3-aminophenoxy)-phenyl] sulfone [BAPS3], bis[4-(4-aminophenoxy)phenyl] sulfone [BAPS4], N,N'-bis[4-(4-aminophenyl)sulfonylphenyl] isophthalamide [SOIPC] and the like.

When a diamine containing no sulfone group is used, it is preferable to combine such a diamine with a tetracarboxylic acid dianhydride having a sulfone group so that the concentration of sulfone group in the main chain comes to 1.25 mmol/g or more and the concentration of carboxyl group comes to 2.6 mmol/g or less.

Concretely, there can be referred to 1,4-diaminobenzene, 1,3-diaminobenzene, 4,4'-diaminobiphenyl, 4,4'-diamino-2, 2'-dimethylbiphenyl, bis(4-aminophenyl)-methane, bis(4-aminophenyl) ether, 1,3-bis(3-aminophenoxy)-benzene, 2,2-bis[4-(4-aminophenoxy)phenyl]propane, bis(4-aminophenyl) ketone, 2,2-bis(4-aminophenyl)propane, 2,2-bis(4-aminophenyl)-1,1,1,3,3,3-hexafluoropropane, bis[4-(4-aminobenzoyloxy)phenyl]methane, bis(3-aminopropyl)-tetramethyldisiloxane, bis[(3-aminopropyl)diphenylsilyl] ether and the like.

Further, it is also possible to use a polyamic acid having a recurring unit represented by general formula [8] simultaneously with the recurring unit represented by general formula [7] as a polyimide precursor of the present invention. The molecular weight per carboxyl group can be varied arbitrarily by using a unit in which a part of tetracarboxylic acid dianhydride is replaced with dicarboxylic acid dichloride in the synthesis of polyamic acid, as seen in the recurring unit represented by general formula [8]. Preferably, tetracarboxylic acid dianhydride, diamine and dicarboxylic acid dichloride are combines so that the concentration of sulfone group comes to 1.25 mmol/g or more and the concentration of carboxyl group comes to 2.6 mmol/g or less in the main chain of the resulting polyamic acid.

In general formula [8], $R^{14}$ is a divalent organic group having no ester linkage in side chain thereof, of which concrete examples include aliphatic hydrocarbon groups having 2 to 50 carbon atoms, aromatic hydrocarbon groups, heterocyclic groups, organic groups having 2 to 50 carbon atoms in the total formed by linking a plurality of the above-mentioned groups via a polyvalent linking group selected from oxygen atom, sulfur atom, methylene, amine, carbonyl, sulfone, ester, sulfonic ester, amido, sulfonamido, urea, carbonate and carbamate, groups formed by further substituting these groups with a substituent such as halogen atom or the like, etc.

$R^{14}$ is a residue of aliphatic or aromatic dicarboxylic acid or a derivative thereof such as dichloride which are conventionally used as a starting material of polyimide precursor.

As said dicarboxylic acid dichloride, there can be referred to phthalic acid dichloride, isophthalic acid dichloride, terephthalic acid dichloride, 4,4'-dicarboxy-biphenyl acid dichloride, bis(4-carboxyphenyl)sulfonic acid dichloride, bis(4-carboxyphenyl) ether acid dichloride and the like.

In the present invention, it is preferable to adjust the constitutional ratio between the recurring units represented by general formula [7] and general formula [8] so that the ratio of the former to the sum of the former and the latter comes to an arbitrary value falling in the range of 5 to 100% by mole, in order to appropriately regulate solubility of the polymer having these recurring units. If this value is too small, dissolution rate of the exposed area is low and sensitivity is low. On the other hand, if this value is too great, dissolution rate of the unexposed area is too high, so that there can be obtained no pattern of high aspect. Accordingly, this value should preferably be in the range of from 20 to 80% by mole.

The photosensitive material used in the present invention readily vaporizes from the resin in the process of imidization, and therefore a relief pattern of high toughness and flatness can be obtained.

Since the relief pattern is based on formation of functional groups of high polarity such as carboxyl group and the like, the quantity of functional groups such as carboxyl group in the resin composition and the quantity of photosensitive material such as orthoquinonediazide compound and the like have an important meaning. A polyimide precursor containing a carboxyl group of high polarity is preferable, because a good relief pattern is obtained therefrom when proportion of such polyimide precursor is 20% by weight or more based on the total resin ingredients.

The photosensitive resin composition of the present invention can easily be obtained by mixing the above-mentioned polyimide precursor and the above-mentioned photosensitive material, if necessary, together with a solvent.

It is also allowable to use in combination a variety of additives which can be used in photosensitive resin compositions such as a triplet sensitizer, an adhesion improver consisting of various amine compounds, a surfactant and the like.

The photosensitive resin composition of the present invention can be made into a relief pattern through a step of coating and drying the composition on a supporting substrate, a step of irradiating it with an electromagnetic wave through intermediation of a photomask, and a step of development. Further, through a step of heat treatment, the polyimide precursor can be formed into a polyimide film.

As the supporting substrate, glass substrate, semiconductor, metallic oxide insulator (for example, $TiO_2$, $SiO_2$, etc.), silicon nitride and the like can be referred to. The coating can be practiced by the method of rotational coating using a spinner or the like. After the coating step, the coating film is dried by means of hot plate, oven or the like.

Subsequently, in the step of irradiating an electromagnetic wave, an active ray such as ultraviolet ray, visible light, radiation or a single wavelength ray such as g-line, i-line, excimer laser or the like is irradiated via a photomask. Of the active rays, i-line is preferred because it can give a relief pattern of high precision and suitably applicable to the photosensitive resin composition of the present invention.

In the step of development, the exposed area is removed by the use of a developing solution, by which a relief pattern is obtained. As preferable developing solutions, alkali developing solutions comprising, for example, sodium hydroxide, potassium hydroxide, sodium silicate, ammonia, ethylamine, diethylamine, triethylamine, triethanolamine, tetramethylammonium hydroxide and the like can be referred to.

Subsequently, in the step of heat treatment, the relief pattern thus obtained is subjected to a heat treatment preferably at 150° to 450° C. whereby a relief pattern of a heat-resistant, imide ring-containing polyimide is formed.

The electronic device of the present invention has a resin film pattern formed from the above-mentioned photosensitive resin composition on a circuit-forming surface or a protecting film-forming surface. As the electronic device, a variety of semiconductor devices, multilayer wiring boards and the like can be referred to. From the viewpoint of function, the resin film acts as a passivation film, a buffer coat film, an alpha ray-shielding film, a junction coat film, an interlayer insulation film, etc.

Next, the present invention is more concretely explained with reference to the following Examples and Comparative Examples.

EXAMPLE 1

Two milliliters of a solution of 2.40 g (11.0 mmol) of di-t-butyl dicarbonate in dioxane was dropwise added at 15° C. to 5 ml of a solution of 1.09 g (10.0 mmol) of 4-aminophenol in dioxane, and the resulting mixture was stirred at room temperature for one hour. After distilling off the solvent under reduced pressure, 5 ml of dioxane and 2.82 g (10.5 mmol) of 1,2-naphthoquinone-2-diazide-5-sulfonyl chloride were added. Then, 2.8 ml (20 mmol) of triethylamine was dropwise added to the reaction mixture at 15° C. and stirred at room temperature for 30 minutes, and the mixture was filtered.

After distilling off the solvent under reduced pressure, 10 ml of methylene chloride and 10 ml of trifluoroacetic acid were added and stirred at room temperature for 20 minutes. After distilling off the solvent under reduced pressure, 30 ml of ether was added, the resulting precipitate was crushed and collected by filtration. The solid material thus obtained was dissolved in 200 ml of methylene chloride and washed with saturated aqueous solution of sodium bicarbonate (200 ml×3) and water (200 ml). By distilling off the solvent under reduced pressure, there was obtained 3.59 g (83%) of 4-(1,2-naphthoquinone-2-diazide-5-sulfoxy)aniline (pAPQ).

At room temperature, 0.188 g (1.0 mmol) of m-xylene diisocyanate was added to a solution of 0.682 g (2.0 mmol) of pAPQ in 1.5 ml NMP. After stirring the mixture at 40° C. for 4 hours, 1.5 ml of NMP was added. By dropping the reaction mixture into 300 ml of water, there was obtained 0.629 g (79%) of 1,3-bis[3-[4-(1,2-naphthoquinone-2-diazide-5-sulfoxy)phenyl]ureidomethyl]-benzene (Chemical Formula I).

At room temperature, 11.97 g (20 mmol) of bis[4-(3,4-dicarboxybenzoyloxy)phenyl]sulfonic acid dianhydride (SOTME) was added to a solution of 4.966 g (20 mmol) of bis(4-aminophenyl) sulfone (DDSO) in 68 ml NMP, and the resulting mixture was stirred at room temperature for 10 hours. By dropping the reaction mixture into 1.5 liters of water, there was obtained 15.1 g of a polyamic acid (SOTME/DDSO) as a solid product.

A solution of polyamic acid (SOTME/DDSO) in γ-butyrolactone (solid component concentration: 23% by weight) was prepared, to which was added 1,3-bis[3-[4-(1, 2-naphthoquinone-2-diazide-5-sulfoxy)phenyl]-ureidomethyl]benzene (Chemical Formula I) prepared above in an amount of 40% by weight based on the solid component. Thus, a photosensitive resin composition was obtained.

The phototosensitive resin composition was coated onto a silicon wafer by spin coating method and then dried at 80° C. for 3 minutes to prepare a film having a film thickness of 6.8 μm.

Using a high pressure mercury lamp, the film was irradiated at 300 mJ/cm$^2$ via an i-line band pass filter and a light-screening mask.

Development in a 2.38% aqueous solution of TMAH gave a positive tone hole pattern of 10 μm□. Film thickness retention in the unexposed area was 95%. By subjecting the pattern to a heat treatment at 300° C. for one hour, there was obtained a relief pattern having a heat decomposition temperature of 450° C. or above and a tensile strength of 15 kg/mm$^2$ or above.

EXAMPLE 2

At 5° C., 0.174 g (1.0 mmol) of toluylene-2,4-diisocyanate was added to a solution of 0.682 g (2.0 mmol) of pAPQ prepared according to Example 1 in 1.5 ml of NMP, and the resulting mixture was stirred at room temperature for 2 hours. By adding 1.5 ml of NMP to the reaction mixture and dropwise adding the mixture to 300 ml of water, there was obtained 0.599 g (70%) of 2,4-bis[3-[4-(1,2-naphthoquinone-2-diazide-5-sulfoxy)phenyl]ureido] toluene (chemical formula II).

A solution of the polyamic acid prepared in Example 1 (SOTME/DDSO) in NMP having a solid component concentration of 23% by weight was prepared. By adding thereto the 2,4-bis[3-[4-(1,2-naphthoquinone-2-diazido-5-sulfoxy)phenyl]ureido]toluene (chemical formula II) prepared above in an amount of 40% by weight based on the solid component, there was obtained a photosensitive resin composition.

The photosensitive resin composition was coated onto a silicon wafer by the method of spin coating and dried at 95° C. for 3 minutes to prepare a film having a film thickness of 5.3 µm.

The film was irradiated with a light of high pressure mercury lamp at a dose of 300 mJ/cm$^2$ via an i-line band pass filter and a light screening mask and then developed in a 2.38% aqueous solution of TMAH for 40 seconds to obtain a positive tone hole pattern of 10 µm□. Film thickness retention in the unexposed area was 90%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 3

At 5° C., 0.238 g (2.0 mmol) of phenyl isocyanate was added to a solution of 0.682 g (2.0 mmol) of pAPQ prepared according to Example 1 in 1.5 ml of NMP, and the resulting mixture was stirred at room temperature for 2 hours. By adding 1.5 ml of NMP to the reaction mixture and dropwise adding the mixture to 300 ml of water, there was obtained 0.846 g (92%) of 1-[4-(1,2-naphthoquinone-2-diazido-5-sulfoxy)phenyl]-3-phenylurea (chemical formula III).

A solution of the polyamic acid prepared in Example 1 (SOTME/DDSO) in NMP having a solid component concentration of 23% by weight was prepared. By adding thereto the 1-[4-(1,2-naphthoquinone-2-diazido-5-sulfoxy)phenyl]-3-phenylurea (chemical formula III) prepared above in an amount of 40% by weight based on the solid component, there was obtained a photosensitive resin composition.

The photosensitive resin composition was coated onto a silicon wafer by the method of spin coating and dried at 95° C. for 3 minutes to prepare a film having a film thickness of 5.5 µm.

The film was irradiated with a light of high pressure mercury lamp at a dose of 300 mJ/cm$^2$ via an i-line band pass filter and a light screening mask and then developed in a 2.38% aqueous solution of TMAH for 40 seconds to obtain a positive tone hole pattern of 10 µm□. Film thickness retention in the unexposed area was 80%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 4

At 5° C., 0.266 g (2.0 mmol) of benzyl isocyanate was added to a solution of 0.682 g (2.0 mmol) of pAPQ prepared according to Example 1 in 1.5 ml of NMP, and the resulting mixture was stirred at 45° C. for 2.5 hours. By dropwise adding the reaction mixture to 100 ml of water, there was obtained 0.911 g (96%) of 1-benzyl-3-[4-(1,2-naphthoquinone-2-diazido-5-sulfoxy)phenyl]urea (chemical formula IV).

A solution of the polyamic acid prepared in Example 1 (SOTME/DDSO) in NMP having a solid component concentration of 23% by weight was prepared. By adding thereto the 1-benzyl-3-[4-(1,2-naphthoquinone-2-diazido-5-sulfoxy)phenyl]urea (chemical formula IV) prepared above in an amount of 40% by weight based on the solid component, there was obtained a photosensitive resin composition.

The photosensitive resin composition was coated onto a silicon wafer by the method of spin coating and dried at 95° C. for 3 minutes to prepare a film having a film thickness of 5.5 µm.

The film was irradiated with a light of high pressure mercury lamp at a dose of 300 mJ/cm$^2$ via a light screening mask and then developed in a 2.38% aqueous solution of TMAH for 40 seconds to obtain a positive tone hole pattern of 10 µm□. Film thickness retention in the unexposed area was 80%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 5

At 10° C., 6.7 ml (120 mmol) of triethylamine was dropwise added to 50 ml of a solution of 10.8 g (40 mmol) of 1,2-naphthoquinone-2-diazido-5-sulfonyl chloride and 4.00 g (20.0 mmol) of 2-t-butoxycarbonylamino-4,6-dihydroxypyrimidine in 50 ml dioxane. The resulting mixture was stirred at room temperature for 3 hours.

After filtration, the filtrate was dropwise added to 2 liters of 1N aqueous solution of hydrochloric acid to form a solid product. The solid product thus obtained was stirred at room temperature for 20 minutes together with 10 ml of methylene chloride and 10 ml of trifluoroacetic acid.

After distilling off the solvent under reduced pressure, 30 ml of ether was added. The resulting precipitate was pulverized and filtered. The solid product thus obtained was dissolved in 200 ml of methylene chloride and washed with saturated aqueous solution of sodium bicarbonate (200 ml×3) and water (200 ml).

By distilling off the solvent under reduced pressure, there was obtained 7.69 g (65%) of 2-amino-4,6-bis(1,2-naphthoquinone-2-diazido-5-sulfoxy)pyrimidine (chemical formula V).

A solution of the polyamic acid prepared in Example 1 (SOTME/DDSO) in NMP having a solid component concentration of 23% by weight was prepared. By adding thereto the 2-amino-4,6-bis(1,2-naphthoquinone-2-diazido-5-sulfoxy)pyrimidine (chemical formula V) prepared above in an amount of 40% by weight based on the solid component, there was obtained a photosensitive resin composition.

The photosensitive resin composition was coated onto a silicon wafer by the method of spin coating and dried at 80° C. for 3 minutes to prepare a film having a film thickness of 6.3 µm.

The film was irradiated with a light of high pressure mercury lamp at a dose of 300 mJ/cm$^2$ via an i-line band pass filter and a light screening mask and then developed in a 2.38% aqueous solution of TMAH for 40 seconds to obtain a positive tone hole patter of 10 µm□. Film thickness retention in the unexposed area was 80%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 6

At room temperature, 11.2 g (20 mol) of bis[4-(3,4-dicarboxybenzoyloxy)phenyl ketone acid dianhydride (COTME) was added to a solution of 4.966 g (20 mmol) of bis(4-aminophenyl) sulfone in 68 ml of NMP, and the resulting mixture was stirred at room temperature for 2 hours.

By adding the reaction mixture dropwise to 1.5 liters of water, there was obtained 15.1 g of a polyamic acid (COTME/DDSO) as a solid product.

A solution of the polyamic acid (SOTME/DDSO) in y-butyrolactone having a solid component concentration of 20% by weight was prepared. By adding thereto the 1-benzyl-3-[4-(1,2-naphthoquinone-2-diazido-5-sulfoxy)phenyl]urea (chemical formula IV) prepared in Example 4 in an amount of 40% by weight based on the solid component, there was obtained a photosensitive resin composition.

The photosensitive resin composition was coated onto a silicon wafer by the method of spin coating and dried at 95° C. for 3 minutes to prepare a film having a film thickness of 5.4 μm.

The film was irradiated with a light of high pressure mercury lamp at a dose of 300 mJ/cm$^2$ via an i-line band pass filter and a light screening mask and then developed in a 2.38% aqueous solution of TMAH for 40 seconds to obtain a positive tone hole patter of 10 μm□. Film thickness retention in the unexposed area was 92%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 7

At room temperature, 4.211 g (20 mmol) of trimellitic acid anhydride chloride (TMA) was added to a solution of 4.966 g (20 mmol) of bis(4-aminophenyl) sulfone in 68 ml of NMP, and the resulting mixture was stirred for 2 hours. Then, 2.9 ml (21 mmol) of triethylamine was added at 5° C. and stirred at room temperature for 10 hours. By dropwise adding the reaction mixture into 1.5 liters of water, there was obtained a polyamic acid (TMA/DDSO) as a solid product in a yield of 9.06 g.

A solution of the polyamic acid (TMA/DDSO) in NMP having a solid component concentration of 20% by weight was prepared. By adding thereto the 1-benzyl-3-[4-(1,2-naphthoquinone-2-diazido-5-sulfoxy)phenyl]urea (chemical formula IV) prepared in Example 4 in an amount of 40% by weight based on the solid component, there was obtained a photosensitive resin composition.

The photosensitive resin composition was coated onto a silicon wafer by the method of spin coating and dried at 80° C. for 2 minutes to prepare a film having a film thickness of 5.1 μm.

The film was irradiated with a light of high pressure mercury lamp at a dose of 300 mJ/cm$^2$ via an i-line band pass filter and a light screening mask and then developed in a 2.38% aqueous solution of TMAH for 40 seconds to obtain a positive tone hole pattern of 10 μm□. Film thickness retention in the unexposed area was 95%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 8

At room temperature, 10.85 g (20 mmol) of bis[4-(3,4-dicarboxyphenoxy)phenyl]sulfonic acid dianhydride (SOPOP) was added to a solution of 4.966 g (20 mmol) of bis(4-aminophenyl) sulfone (DDSO) in 68 ml of NMP. The resulting mixture was stirred at room temperature for 10 hours. The reaction mixture was dropwise added to 1.5 liters of water to obtain a polyamic acid (SOPOP/DDSO) as a solid product in a yield of 14.2 g.

A solution of the polyamic acid (SOPOP/DDSO) in NMP having a solid component concentration of 18% by weight was prepared. By adding thereto the 1-benzyl-3-[4-(1,2-naphthoquinone-2-diazido-5-sulfoxy)phenyl]urea (chemical formula IV) prepared in Example 4 in an amount of 40% by weight based on the solid component, there was obtained a photosensitive resin composition.

The photosensitive resin composition was coated onto a silicon wafer by the method of spin coating and dried at 80° C. for 3 minutes to prepare a film having a film thickness of 6.5 μm.

The film was irradiated with a light of high pressure mercury lamp at a dose of 300 mJ/cm$^2$ via an i-line band pass filter and a light screening mask and then developed in a 2.38% aqueous solution of TMAH for 50 seconds to obtain a positive tone hole pattern of 10 μm□. Film thickness retention in the unexposed area was 95%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 9

At room temperature, 3.583 g (10 mmol) of bis(3,4-dicarboxyphenyl)sulfonic acid dianhydride (DSDA) was added to a solution of 4.966 g (20 mmol) of bis(4-aminophenyl) sulfone (DDSO) in 68 ml of NMP.

After stirring for 2 hours, 2.030 g (10 mmol) of isophthalic acid dianhydride (IPC) was added and stirred for 2 hours. By dropwise adding thereto 2.9 ml (21 mmol) of triethylamine at 5° C., stirring the resulting mixture at room temperature for 10 hours and dropwise adding the reaction mixture into 1.5 liters of water, 10.2 g of a polyamic acid (DSDA/IPC/DDSO) was obtained as a solid product.

A solution of the polyamic acid (DSDA/IPC/DDSO) in NMP having a solid component concentration of 17% by weight was prepared. By adding thereto the 1-benzyl-3-[4-(1,2-naphthoquinone-2-diazido-5-sulfoxy)phenyl]urea (chemical formula IV) prepared in Example 4 in an amount of 40% by weight based on the solid component, there was obtained a photosensitive resin composition.

The photosensitive resin composition was coated onto a silicon wafer by the method of spin coating and dried at 80° C. for 3 minutes to prepare a film having a film thickness of 6.5 μm.

The film was irradiated with a light of high pressure mercury lamp at a dose of 300 mJ/cm$^2$ via an i-line band pass filter and a light screening mask and then developed in a 2.38% aqueous solution of TMAH for 30 seconds to obtain a positive tone hole pattern of 10 μm□. Film thickness retention in the unexposed area was 95%.

The pattern was further heat treated at 300° C. for one hour. Thus, a relief pattern having a heat decomposition temperature of 450° C. or above and a tensile strength of 15 kg/mm$^2$ or above was obtained.

EXAMPLE 10

A mixture of 12.3 g (38.3 mmol) of benzophenonetetracarboxylic acid dianhydride (BTDA) and 12.0 g (162 mmol) of butanol was heated under reflux for one hour with stirring. The excessive butanol was distilled off under reduced pressure. After adding 50 ml of benzene, 11.0 g (46.0 mmol) of thionyl chloride was dropwise added at room temperature. The resulting mixture was heated under reflux for one hour with stirring and the excessive thionyl chloride was distilled off under reduced pressure. Thus, the corresponding benzophenonetetracarboxylic acid dibutyl ester dichloride (BTDBuCl) was obtained in the form of a solid product.

A solution of 5.83 g (38.3 mmol) of 3,5-diaminobenzoic acid (DABA) in 40 ml NMP was dropwise added to the a solution of the BTDBuCl obtained above in 50 ml of N-methyl-2-pyrrolidone (NMP) while keeping the resulting solution at a temperature not exceeding 5° C., and the mixture thus obtained was stirred at room temperature for 30 minutes. After filtration, the filtrate was dropwise added to 3 liters of water. Thus, a polyamic acid ester having a skeleton of dibutyl benzophenoneteracarboxylate was obtained in the form of a solid product.

A solution of the polyamic acid ester obtained above in NMP having a solid component concentration of 30% by weight was prepared. By adding thereto the 1-benzyl-3-[4-(1,2-naphthoquinone-2-diazido-5-sulfoxy)phenyl]urea (chemical formula IV) prepared in Example 4 in an amount of 30% by weight based on the solid component, there was obtained a photosensitive resin composition.

The photosensitive resin composition was coated onto a silicon wafer by the method of spin coating and dried at 80° C. for 2 minutes to prepare a film having a film thickness of 6.5 µm.

The film was irradiated with a light of high pressure mercury lamp at a dose of 300 mJ/cm$^2$ via an i-line band pass filter and a light screening mask and then developed in a 2.38% aqueous solution of TMAH for 90 seconds to obtain a positive tone hole pattern of 10 µm□. Film thickness retention in the unexposed area was 97%.

The pattern was further heat treated at 300° C. for one hour. Thus, a relief pattern having a heat decomposition temperature of 450° C. or above and a tensile strength of 15 kg/mm$^2$ or above was obtained.

Table 1 lists the dissolution velocities in the exposed and unexposed areas of the photosensitive resin composition of Examples 1 to 10.

Comparative Example 1

A photosensitive resin composition was prepared by repeating the procedure of Example 4, except that the 4,4'-bis(1,2-naphthoquinone-2-diazido-5-sulfonylamino)diphenyl ether was replaced with a tri-(1,2-naphthoquinone-2-diazido-5-sulfonic acid) ester of 2,3,4,4'-tetrahydroxybenzophenone.

The photosensitive resin composition was coated onto a silicon wafer by the method of spin coating and dried at 80° C. for 3 minutes to obtain a film having a film thickness of 6.0 µm.

The film was irradiated with a light of high pressure mercury lamp via an i-line band pass filter and a light screening mask at a dose of 300 mJ/cm$^2$ and then developed with a 2.38% aqueous solution of TMAH for 20 seconds. As a result, the whole film dissolved and there could be obtained no positive tone pattern.

Comparative Example 2

A solution of a 7/3 copolymer of methacrylic acid/methyl methacrylate in NMP having a solid component concentration of 20% by weight was prepared. By adding thereto 1-benzyl-3-[4-(1,2-naphthoquinone-2-azido-5-sulfoxy)phenyl]urea (chemical formula IV) prepared in Example 4 in an amount of 40% by weight based on the solid component, there was obtained a photosensitive resin composition.

The photosensitive resin composition was coated onto a glass substrate by the method of spin coating and dried at 95° C. for 2 minutes to obtain a film having a film thickness of 1.5 µm.

Then the film was irradiated with a light of high pressure mercury lamp at a dose of 300 mJ/cm$^2$ via an i-line band pass filter and a light screening mask and developed in a 2.38% aqueous solution of TMAH for 20 seconds. As a result, the whole film dissolved and there could be obtained no positive tone pattern.

The dissolution velocities of the exposed and unexposed areas in Comparative Examples 1 and 2 are listed in Table 1.

TABLE 1

|  |  | Polymer | Chemical formula of photosensitive material | Dissolution rate (µm/minute) | |
|---|---|---|---|---|---|
|  |  |  |  | Unexposed area | Exposed area |
| Example | 1 | SOTME/DDSO | I | 0.7 | 23 |
|  | 2 | " | II | 1.0 | 23 |
|  | 3 | " | III | 0.8 | 21 |
|  | 4 | " | IV | 0.5 | 22 |
|  | 5 | " | V | 1.0 | 28 |
|  | 6 | COTME/DDSO | IV | 0.4 | 12 |
|  | 7 | TME/DDSO | IV | 0.9 | 30 |
|  | 8 | SOPOP/DDSO | IV | 0.3 | 13 |
|  | 9 | DSDA/IPC/DDSO | IV | 0.6 | 22 |
|  | 10 | BTDBu/DABA | IV | 0.2 | 4.5 |
| Comparative | 1 | SOTME/DDSO | 4NT-300 | 24.0 | 28 |
| Example | 2 | Methacrylic acid | IV | 3.5 | 4.5 |

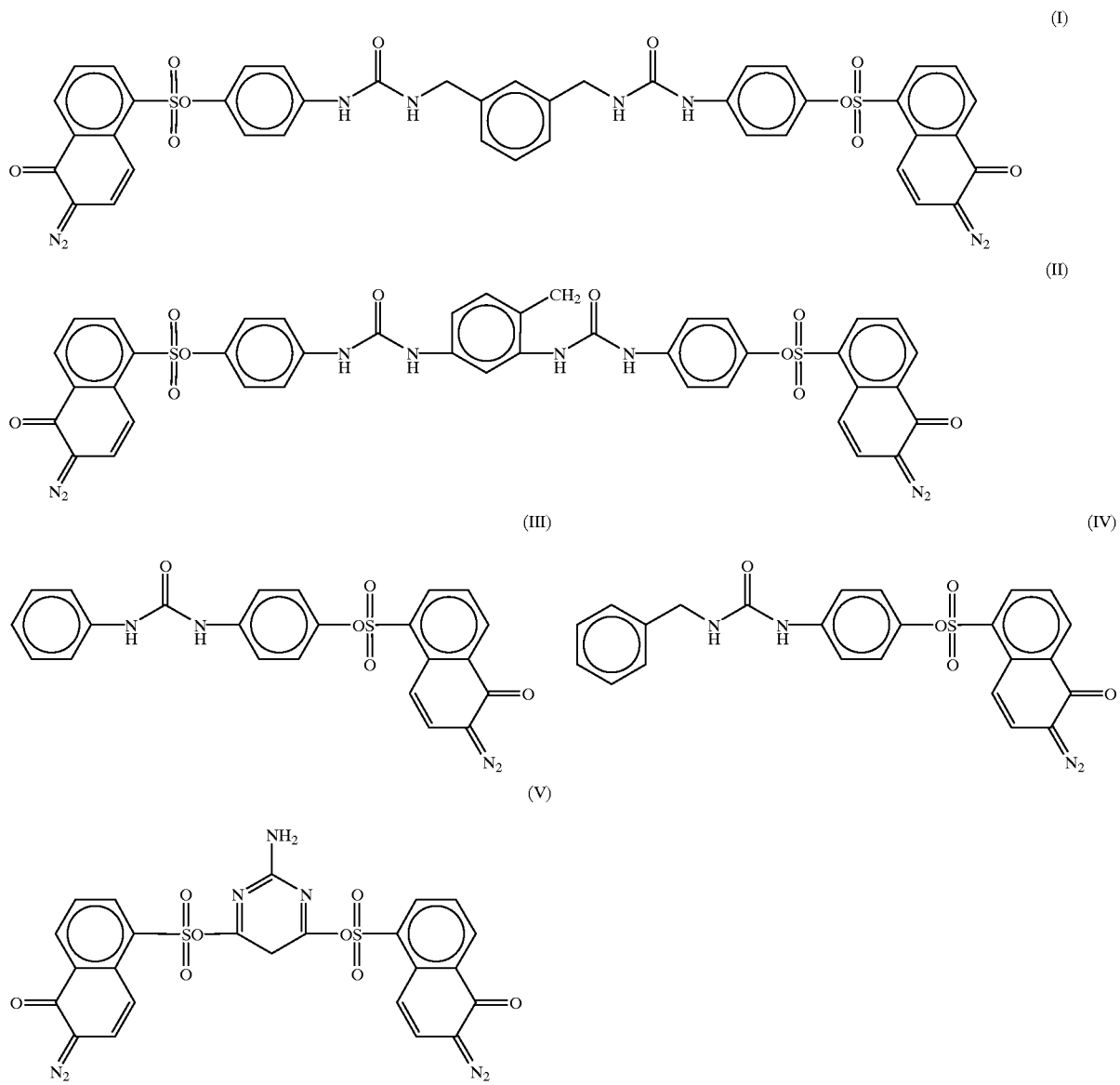

EXAMPLE 11

A solution of the polyamic acid (SOTME/DDSO) prepared in Example 4 in NMP having a solid component content of 26% by weight was prepared. By adding thereto the 1-benzyl-3-[4-(1,2-naphthoquinone-2-diazido-5-sulfoxy)phenyl]urea (chemical formula IV) prepared in Example 4 in an amount of 40% by weight based on the solid component, a photosensitive resin composition was obtained.

The photosensitive resin composition was coated onto a silicon wafer by the method of spin coating and dried at 95° C. for 3 minutes to prepare a film having a film thickness of 10 µm.

The film was irradiated with the light of high pressure mercury lamp at a dose of 400 mJ/cm$^2$ via an i-line band pass filter and a light screening mask and then developed with a 2.38% aqueous solution of TMAH for 50 seconds to obtain a positive tone hole pattern of 10 µm□. The film thickness retention in the unexposed area was 90%.

The pattern was further heat treated at 300° C. for one hour. Thus, there was obtained a relief pattern having a heat decomposition temperature of 450° C. or above and a tensile strength of 15 kg/mm$^2$ or above.

EXAMPLE 12

A solution of the polyamic acid (SOPOP/DDSO) prepared in Example 8 in NMP having a solid component content of 22% by weight was prepared. By adding thereto the 1-benzyl-3-[4-(1,2-naphthoquinone-2-diazido-5-sulfoxy)phenyl]urea (chemical formula IV) prepared in Example 4 in an amount of 40% by weight based on the solid component, a photosensitive resin composition was obtained.

The photosensitive resin composition was coated onto a silicon wafer by the method of spin coating and dried at 95° C. for 3 minutes to prepare a film having a film thickness of 10 µm.

The film was irradiated with the light of high pressure mercury lamp at a dose of 400 mJ/cm$^2$ via an i-line band pass filter and a light screening mask and then developed with a 2.38% aqueous solution of TMAH for 60 seconds to obtain a positive tone hole pattern of 10 μm□. The film thickness retention in the unexposed area was 93%.

The pattern was further heat treated at 300° C. for one hour. Thus, there was obtained a relief pattern having a heat decomposition temperature of 450° C. or above and a tensile strength of 15 kg/mm² or above.

EXAMPLE 13

FIG. 1 illustrates the process for producing a buffer coat film using the photosensitive resin composition of the present invention.

Figure 1B:
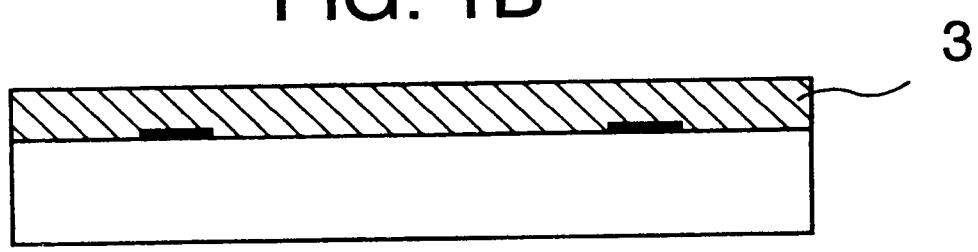
Figure 1C:
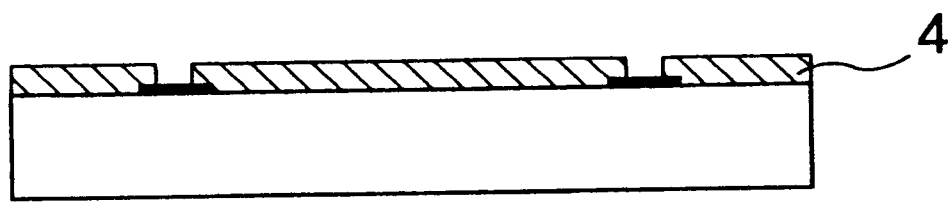

Bonding pad 2 was formed on LSI wiring layer 1 to give a silicon wafer of FIG. 1A. The silicon wafer was coated with the photosensitive resin composition of Example 1, expressed by the numeral 3, (FIG. 1B). Then, through steps of exposure to light and development, a buffer coat film consisting of a polyimide film 4 having holes for connection to bonding wire was formed (FIG. 1C). Since the step of development used no organic solvent, no equipment was necessary for disposal of organic matter, and the burden of waste solvent treatment was much lightened.

EXAMPLE 14

FIG. 2 illustrates the process for producing an LSI having copper/polyimide wiring using the photosensitive resin composition of the present invention.

Figure 2A:
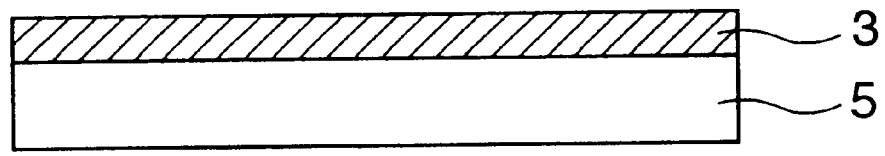
FIGS. 2A to 2E are schematic sectional views illustrating a process for producing an LSI having copper/polyimide wiring using the photosensitive resin composition of the present invention.
Figure 2B:
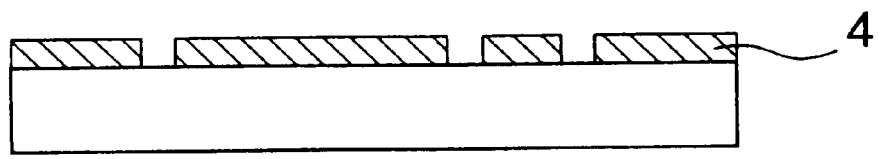
Figure 2C:
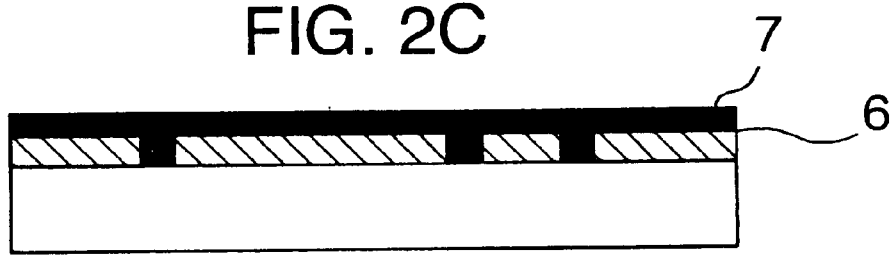
Figure 2D:
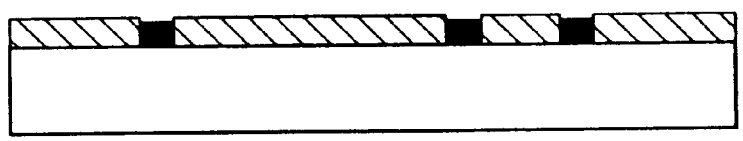
Figure 2E:
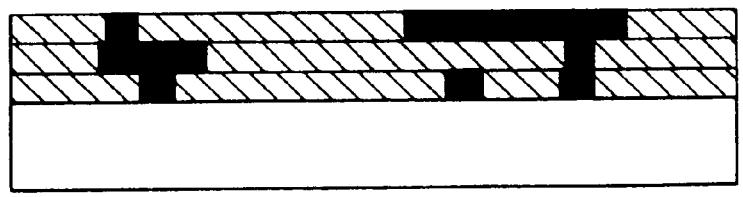

As shown in FIG. 2A, the same photosensitive resin composition 3 as used in Example 1 was spin-coated on silicon wafer 5. As shown in FIG. 2B, a wiring pattern was formed by exposure to light and development, and polyimide 4 having a film thickness of about 0.7 μm was prepared by thermal imidization. Then, as shown in FIG. 2C, a tantalum/copper layer 6 (protecting layer for polyimide 4) was formed up to a thickness of 800 A by sputtering, and thereon was formed copper layer 7 of about 1 μm. In FIG. 2D, copper layer 7 was flatly and smoothly polished by the method of CMP (chemical-mechanical polish) to obtain a wiring layer. By repeating the procedures of 2A to 2D, an LSI having the copper/polyimide wiring of FIG. 2E was prepared.

Since the step of development used no organic solvent, no equipment was necessary for disposal of organic matter, and the burden of treating waste solvent was much lightened.

EXAMPLE 15

FIG. 3 illustrates a process for producing an LSI having a multilayer Al wiring structure using the photosensitive resin composition of the present invention.

Figure 3A:
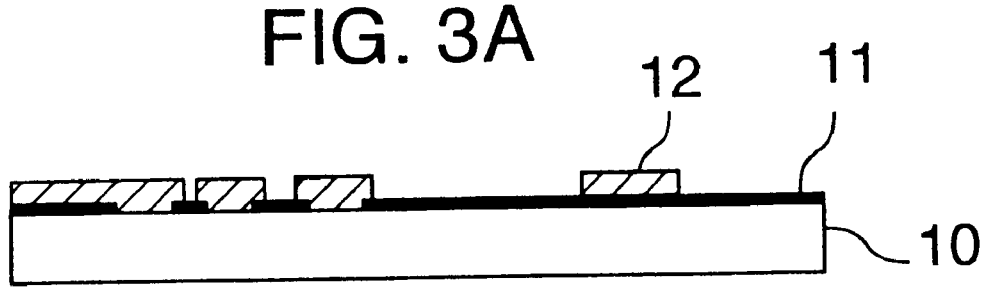
FIGS. 3A to 3D are schematic sectional views illustrating a process for producing an LSI having a multilayer Al wiring structure using the photosensitive resin composition of the present invention.

An Al film was formed on a silicon wafer 10 having SiO₂ film 11 on the surface thereof as shown in FIG. 3A, and the Al film was eliminated from the unnecessary portion by the known etching technique to provide the first wiring layer 12 having the desired wiring pattern. The wiring layer 12 was electrically connected to a semiconductor element via through-holes provided in the prescribed positions of SiO₂ film 11.

Figure 3B:
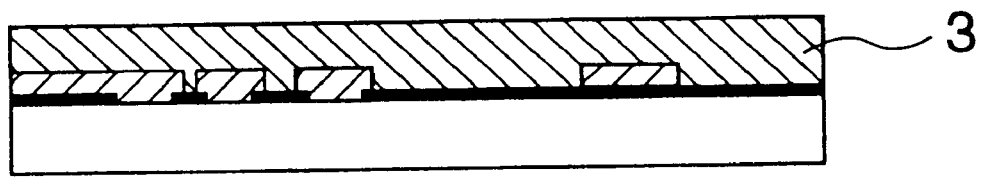
Figure 3C:
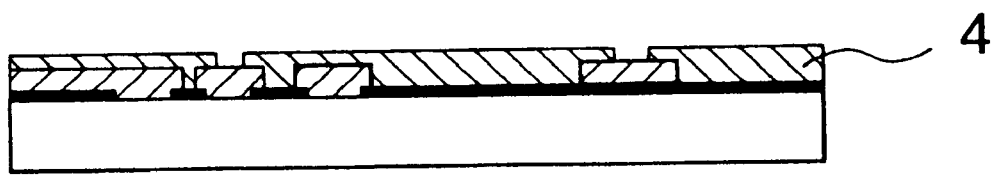
Figure 3D:
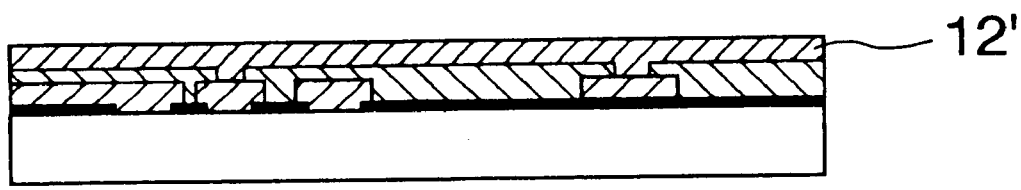

Subsequently, as shown in FIG. 3B, the same photosensitive resin composition 3 as used in Example 1 was spin coated. As shown in FIG. 3C, a wiring pattern was formed by exposure to light and development, and polyimide 4 having a film thickness of about 0.5 μm was formed by thermal imidization. As shown in FIG. 3D, a second wiring layer 12' consisting of Al film was formed on the polyimide 4 in the same manner as above, and electrically connected to the first wiring layer 12 to form a circuit.

By repeating the procedures of FIGS. 3A to 3D, an LSI having a multilayer Al wiring structure was prepared. Since the step of development used no organic solvent, no equipment was necessary for disposal of organic matter and the burden of treating waste solvent was much lightened.

Industrial Utilizability

The positive tone photosensitive resin composition of the present invention can be developed with an alkaline solvent, and makes it possible to obtain a relief pattern of high sensitivity, high resolution, high strength and excellent heat resistance.

What is claimed is:

1. A photosensitive resin composition, comprising:

a polyimide precursor;

a first photosensitive material including a structure represented by formula (1):

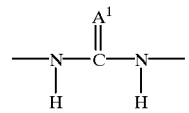

(1)

wherein $A^1$ is an atom selected from the group consisting of Group VI of the periodic table; and/or a second photosensitive material including a structure represented by formula (2):

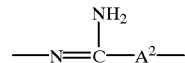

(2)

wherein $A^2$ is an atom selected from the group consisting of oxygen atom, sulfur atom and nitrogen atom;

wherein one or more of said first and second photosensitive materials is a orthoquinonediazide compound.

2. The photosensitive resin composition according to claim 1, wherein said polyimide precursor is a polyimide precursor having a group selected from the group consisting of a carboxyl group, a phenolic hydroxyl group, an amido group and a sulfonamido group.

3. The photosensitive resin composition according to claim 2, wherein said polyimide precursor is a polyimide precursor having a carboxyl group.

4. The photosensitive resin composition according to claim 1, wherein said polyimide precursor is a polyamic acid ester containing a first recurring unit represented by formula (5):

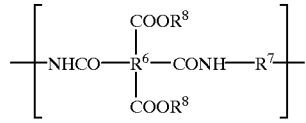

(5)

wherein

R$^6$ is a tetravalent organic group;

R$^7$ is a divalent organic group selected from the group consisting of a phenolic hydroxyl group, a carboxyl group, an amido group and a sulfonamido group; and R$^8$ is a monovalent organic group, in a proportion of 5 to 100% by moles and a second recurring unit represented by formula (6):

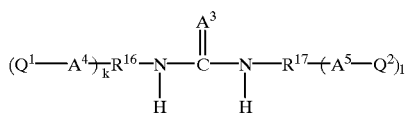

(6)

wherein

R$^9$ is a tetravalent organic group;

R$^{10}$ is a divalent organic group; and

R$^{11}$ is a monovalent organic group, in a proportion of 95 to 0% by mole.

5. The photosensitive resin composition according to claim 1, wherein said photosensitive material is a compound represented by formula (9):

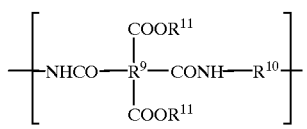

(9)

wherein

Q$^1$ and Q$^2$ each independently represents an orthoquinonediazido-sulfonyl group;

A$^3$ is an atom selected from the group consisting of Group VI of the periodic table;

A$^4$ and A$^5$ each independently represents an oxygen atom or imino group;

R$^{16}$ and R$^{17}$ each independently represents a hydrocarbon group having 2 to 30 carbon atoms or a heterocyclic group; and k and l each independently represents an integer of 1 to 5.

6. The photosensitive resin composition according to claim 1, wherein said photosensitive material is a compound represented by formula (10):

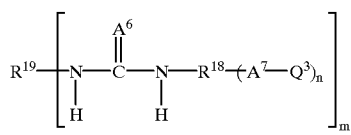

(10)

wherein

Q$^3$ is orthoquinonediazido-sulfonyl group;

A$^6$ is an atom selected from the group consisting of Group VI of the periodic table;

A$^7$ is oxygen atom or imino group;

R$^{18}$ is a (n+1)-valent hydrocarbon group having 2 to 30 carbon atoms or a heterocyclic group;

R$^{19}$ is an m-valent hydrocarbon group having 2 to 30 carbon atoms or a heterocyclic group;

m is an integer of 1 to 10; and n is an integer of 1 to 5.

7. The photosensitive resin composition according to claim 1, wherein said photosensitive material is a compound represented by formula (11):

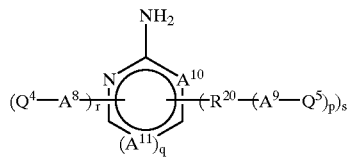

(11)

wherein

Q$^4$ and Q$^5$ each independently represents orthoquinonediazido-sulfonyl group;

A$^8$ and A$^9$ each independently represents an oxygen atom or imino group;

A$^{10}$ represents an atom selected from the group consisting of an oxygen atom, a sulfur atom, a nitrogen atom and an imino group;

A$^{11}$ represents a group selected from the group consisting of an nitrogen atom, a carbon atom and CH;

R$^{20}$ represents a (p+1)-valent hydrocarbon group having 2 to 30 carbon atoms or a (p+1)-valent heterocyclic group; wherein the substituent represented by —A$^8$—Q$^4$ or —(—R$^{20}$—(—A$^9$—Q$^5$)$_p$) is linked to A$^{11}$ or a carbon atom adjacent to A$^{11}$;

s and r each independently represents an integer of 0 to 5; wherein s+r is equal to 1 to 5;

p represents an integer of 1 to 5 and q represents an integer of 0 to 5.

* * * * *